United States Patent [19]

Onodera et al.

[11] 3,974,463
[45] Aug. 10, 1976

[54] ELASTIC SURFACE WAVE APPARATUS
[75] Inventors: Toshihiro Onodera; Kazue Sekikawa, both of Kawasaki, Japan
[73] Assignee: Tokyo Shibaura Electric Co., Ltd., Kawasaki, Japan
[22] Filed: Sept. 5, 1975
[21] Appl. No.: 610,890

[30] Foreign Application Priority Data
Sept. 9, 1974    Japan................... 49-102991

[52] U.S. Cl............................. 333/30 R; 310/9.5; 310/9.8; 333/72
[51] Int. Cl.² ................. H03H 9/32; H03H 9/30; H03H 9/26; H01L 41/18
[58] Field of Search.............. 333/72, 30 R; 310/8, 310/8.1, 8.2, 8.3, 9.8, 9.5

[56] References Cited
UNITED STATES PATENTS
3,591,813    7/1971    Coquin et al. ................... 310/9.5
3,873,946    3/1975    Weglein ........................... 333/30 R Primary Examiner—Alfred E. Smith
Assistant Examiner—Marvin Nussbaum
Attorney, Agent, or Firm—Cushman, Darby & Cushman

[57] ABSTRACT

An elastic surface wave apparatus, wherein transmission and reception electrode pairs for conversion of electric signals into elastic surface waves are spatially disposed so as to cause said surface waves to be propagated over the X-Z axis surface of a Y-cut lithium niobate (LiNbO₃) piezoelectric element in a direction inclined 0.5 to 7 degrees relative to the Z axis.

6 Claims, 12 Drawing Figures

FIG. 1 PRIOR ART
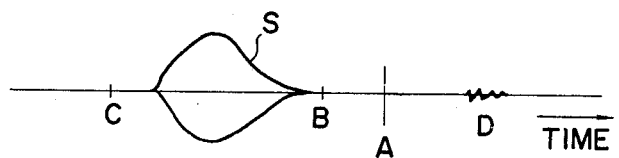
FIG. 2
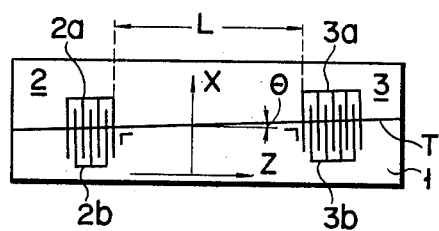
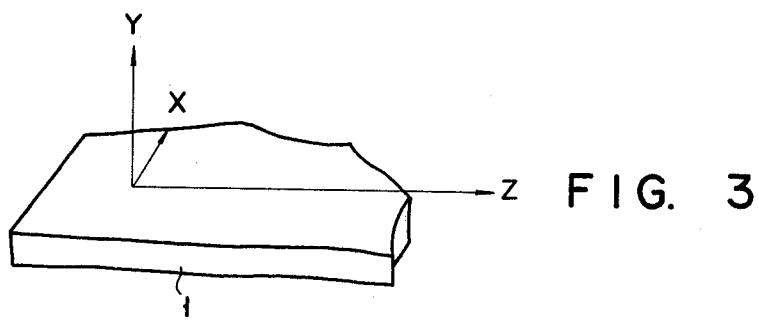
FIG. 3
FIG. 4
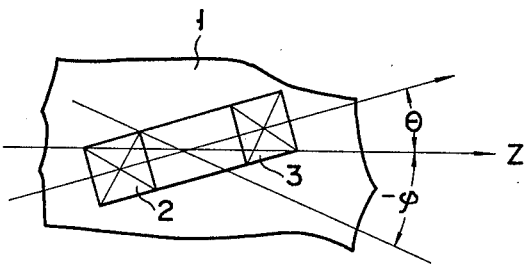

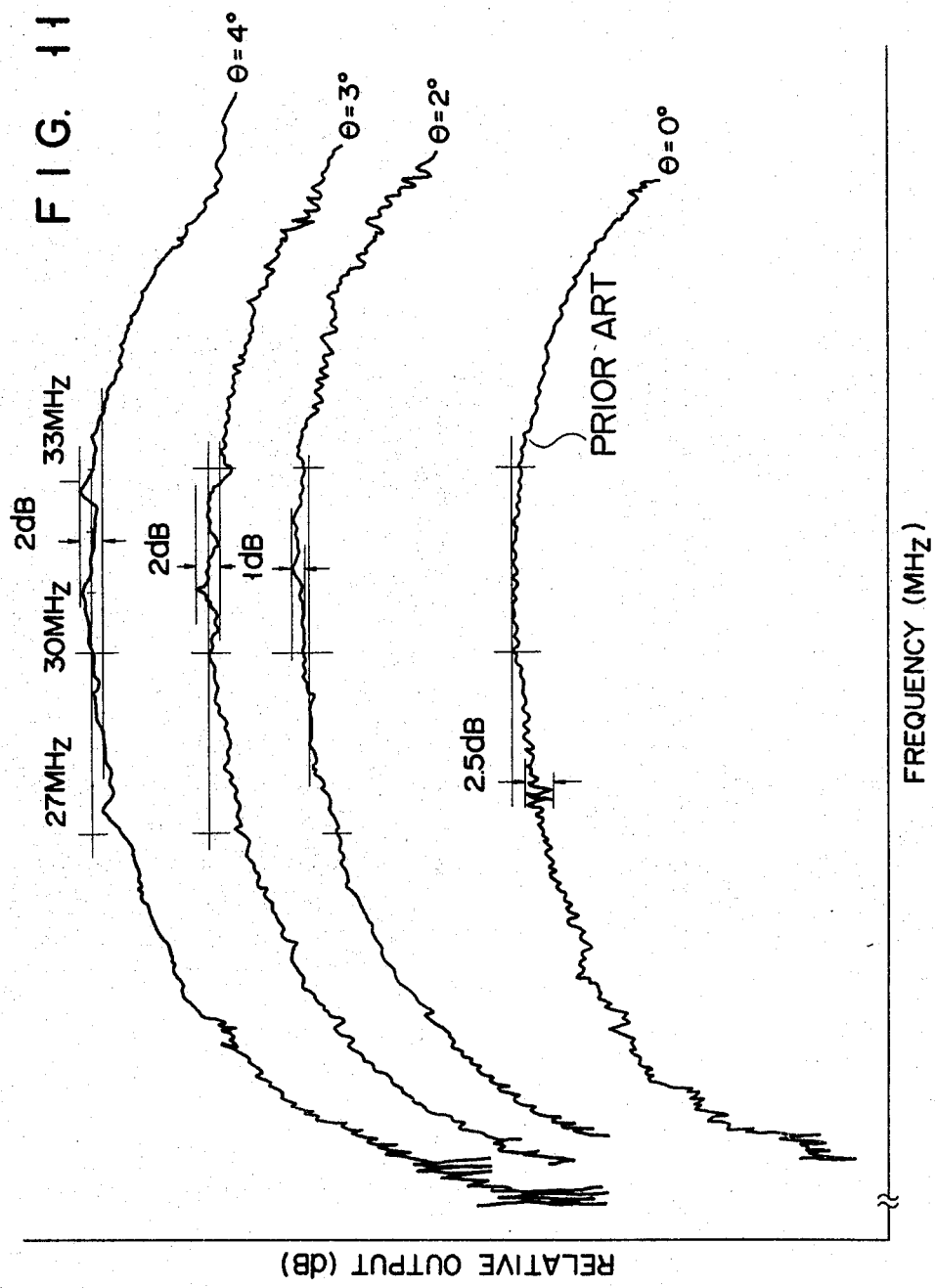

ELASTIC SURFACE WAVE APPARATUS

This invention relates to an elastic surface wave apparatus and more particularly to an improved type of elastic surface wave apparatus capable of suppressing the occurrence of spurious signal components.

In recent years, an elastic surface wave apparatus has come into practical application which uses a lithium niobate (LiNbO$_3$) piezoelectric element having a large coupling coefficient and a high efficiency of converting electric signals into elastic surface waves. This apparatus includes conversion electrode pairs for transmission and reception which are disposed along the Z axis of the surface of a piezoelectric substitute formed by Y-cutting a lithium niobate piezoelectric element so as to cause elastic surface waves to be propagated along the Z axis. FIG. 1 relates to the prior art elastic surface wave apparatus and shows the wave form of an output signal from a reception electrode pair, where a transmission electrode pair is supplied with a signal having its amplitude modulated by a carrier of 30 MHz frequency. In this case, the reception electrode pair produces first a noise component C due to crosstalk and then a compressed normal signal component S. This normal signal component S is followed by spurious noise components B, A, D. D denotes a spurious noise component reproduced by the reception electrode pair after being reflected three times back and forth between the transmission and reception electrode pairs. The spurious noise components B, A, D which appear later than the normal signal component S are liable to be mistaken as said normal signal component S, when an elastic surface wave apparatus is applied as a delay element or filter.

It is accordingly the object of this invention to provide an elastic surface wave apparatus capable of effectively suppressing the occurrence of spurious signal components.

According to an aspect of this invention, there is provided an elastic surface wave apparatus which comprises a Y-cut lithium niobate (LiNbO$_3$) piezoelectric substrate and provided with a surface defined by the X and Z axes; and at least one electrode pair for converting electric signals into elastic surface waves, thereby enabling elastic surface waves to be propagated in a direction inclined 0.5 to 7 degrees relative to the Z axis.

This invention can be more fully understood from the following detailed description when taken in conjunction with the accompanying drawings, in which:

FIG. 1 presents the wave form of an output signal from the reception electrode pair of the prior art elastic surface wave apparatus;

FIG. 2 is a schematic plan view of an elastic surface wave apparatus according to an embodiment of this invention;

FIG. 3 is an oblique view of a piezoelectric substrate used with the apparatus of FIG. 2, showing the crystalline axes of said substrate;

Figure 5:
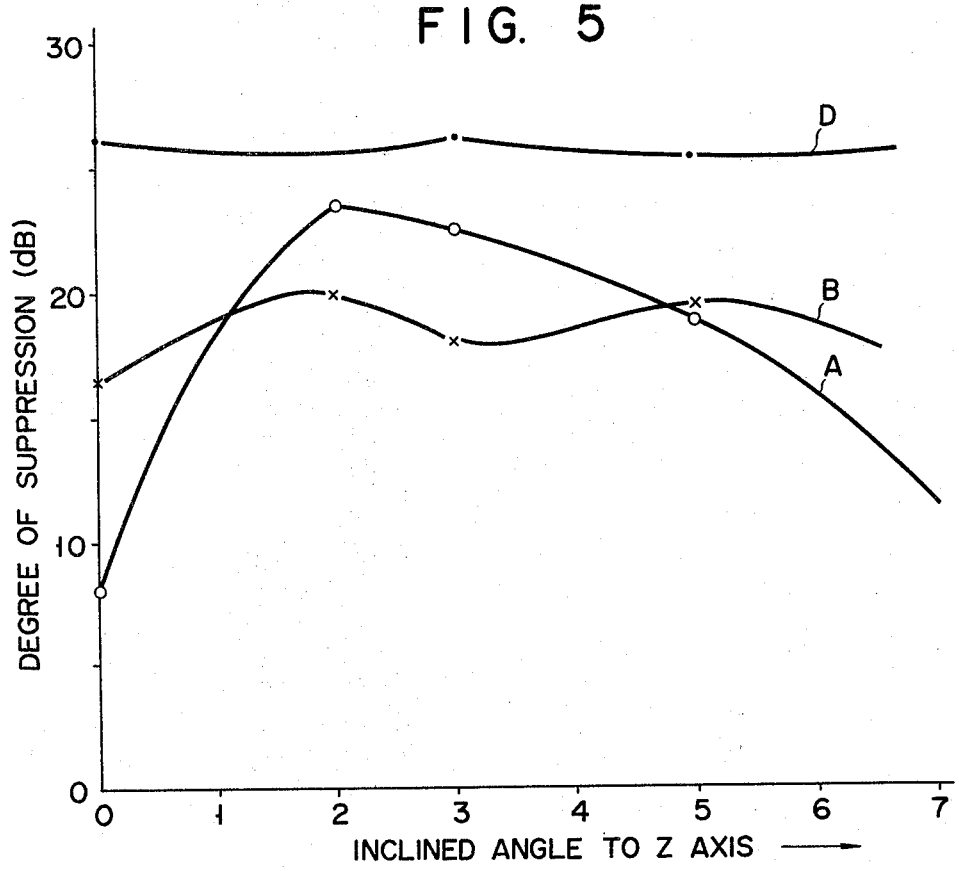
Figure 8:
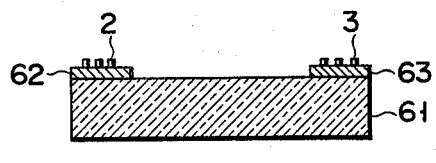
Figure 9:
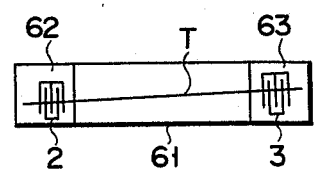
Figure 6:
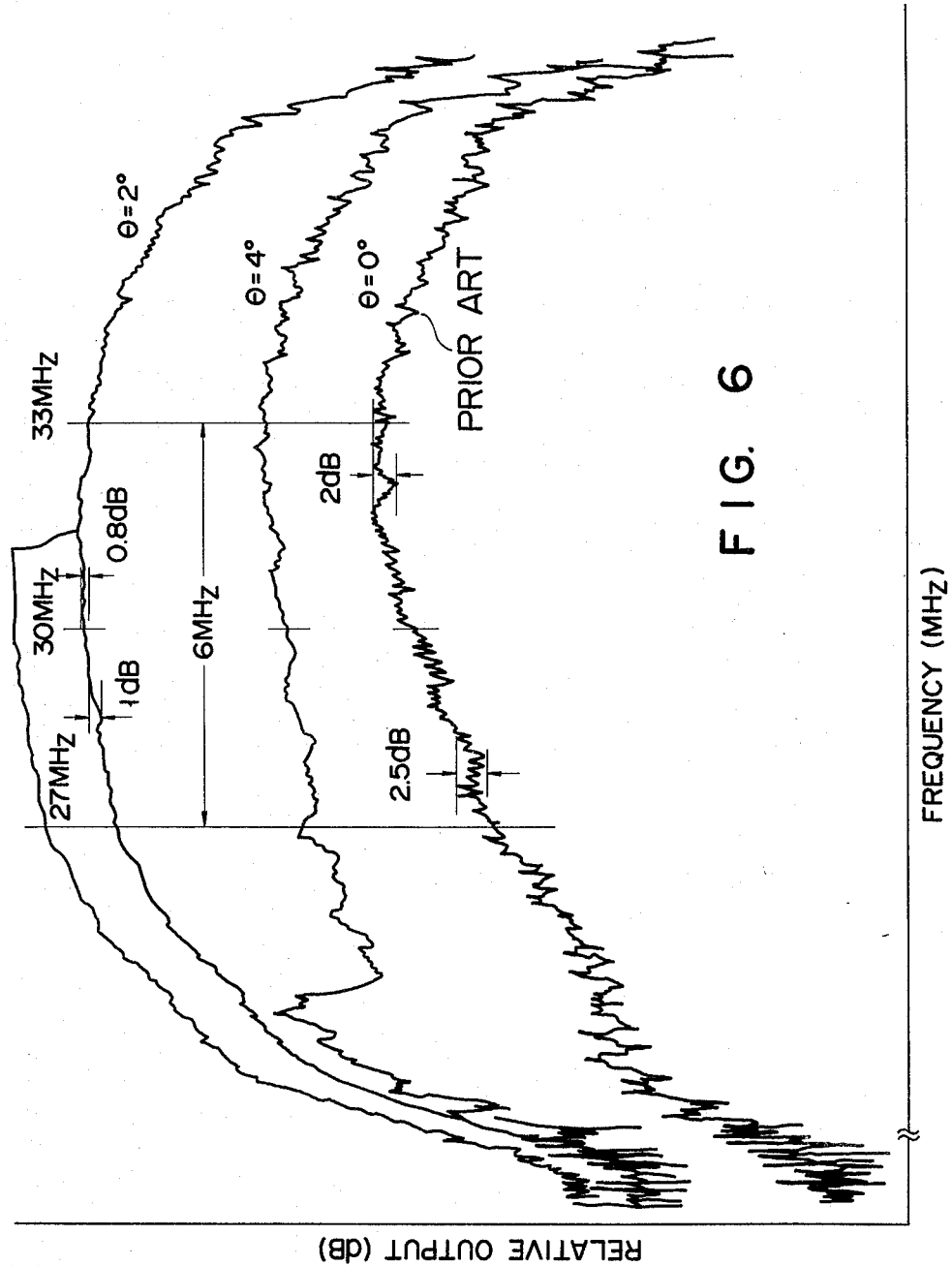
Figure 7:
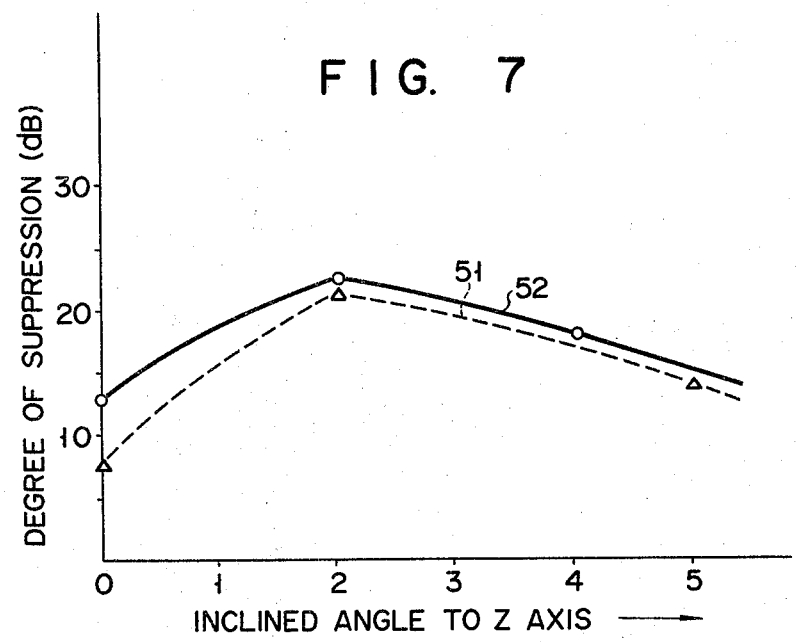
Figure 10:
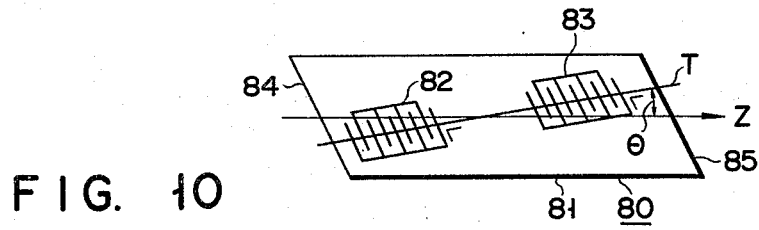
Figure 12:
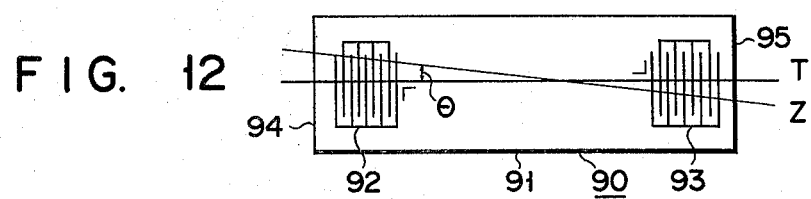

FIG. 4 indicates the relationship between the crystalline axis Z of said piezoelectric substrate and the direction in which an elastic surface wave is propagated over said substrate;

FIG. 5 is a curve diagram showing the different degrees in which spurious noise components included in an output signal from the reception electrode pair of an elastic surface wave apparatus according to the embodiment of FIG. 2 are suppressed according to the angles of inclination defined by the propagation axis of an elastic surface wave with the Z axis;

FIG. 6 is a curve diagram showing the ripple characteristic of the elastic surface wave apparatus of FIG. 2;

FIG. 7 is a curve diagram showing the different degrees in which the above-mentioned spurious noise components are suppressed according to the angles of inclination defined by the propagation axis of an elastic surface wave with the Z axis, where a distance between the transmission and reception electrode pairs of the apparatus of FIG. 2 is varied;

FIG. 8 is a longitudinal sectional view of an elastic surface wave apparatus according to another embodiment of the invention;

FIG. 9 is a schematic plan view of the apparatus of FIG. 8;

FIG. 10 is a schematic plan view of a modification of the apparatus of FIG. 2;

FIG. 11 is a curve diagram showing the ripple characteristic of the apparatus of FIG. 10; and FIG. 12 is a schematic plan view of another modification of the apparatus of FIG. 2.

Referring to FIG. 2, referential numeral 1 denotes a Y-cut piezoelectric substrate of lithium niobate (LiNbO$_3$). This piezoelectric substrate 1 has a surface defined, as shown in FIG. 3, by the X and Z axes. A transmission electrode pair 2 and reception electrode pair 3 are disposed on said surface at a distance of L in such a manner that the main propagation axis T of an elastic surface wave is inclined at an angle $\theta$ of, for example, 5° relative to the Z axis. The transmission electrode pair is formed, as shown in FIG. 2, of a pair of interdigitated electrodes 2a, 2b, which are positioned substantially at right angles to the main propagation axis T of an elastic surface wave. The reception electrode pair 3 also consists of a pair of interdigitated electrodes 3a, 3b which are disposed substantially at right angles to the main propagation axis T of the elastic surface wave. As illustrated in FIG. 2, the main propagation axis T of the elastic surface wave is inclined relative to the Z axis so as to rise from the lower left side to the upper right side. However, it is possible to cause the main propagation axis T to be inclined relative to the Z axis, as shown in FIG. 4, at a degree of $-\phi$ from the upper left side to the lower right side.

Four samples of the elastic surface wave apparatus of FIG. 2 were prepared, using a lithium niobate (LiNbO$_3$) substrate 1, 40 mm long in the Z axis, 10 mm long in the X axis and 1 mm thick in the Y axis, while the degree of inclination defined by the main propagation axis T with the Z axis was changed to 0°, 2°, 3° and 5° respectively. Each sample was provided with transmission and reception electrode pairs 2, 3, each of which was formed of 160 pairs of interdigitated electrodes. With the samples thus prepared, an electric signal passing therethrough indicated a frequency band width of 6 MHz where said electric signal had a central frequency of 30 MHz and was delayed 5 microseconds during transit.

There will now be described the operation characteristic of the above-mentioned samples. All these samples suppressed the spurious noise component A of FIG. 1 as shown by the curve A of FIG. 5. Namely, where the angle of inclination defined by the main propagation axis T of an elastic surface wave with the Z axis stood at zero, the spurious noise component A was suppressed by about 7.5 (dB). The inclination degree of 2° led to a suppression of 24 (dB), the inclination degree of 3° to a suppression of 22 (dB) and the inclination degree of 5° to a suppression of about 18 (dB). The curve A of FIG. 5 was formed by connecting these measured values in turn. The curve A shows that inclination ranging between about 0.5° and 2° attained sharply increasing suppression, whereas larger inclination up to 7° resulted in slowly declining suppression. Where, therefore, a practically required range of suppression is taken to lie between 11 and 12 (dB), then inclination from 0.5° to 7° will be found to serve the purpose.

The above-mentioned samples of the elastic surface wave apparatus of FIG. 2 suppressed the spurious noise components B, D of FIG. 1 as shown by the curves B, D of FIG. 5 respectively. It is seen that where the angle of inclination defined by the main propagation axis T of an elastic surface wave with the Z axis falls within the range of 0.5° to 7°, the spurious noise component B is suppressed at a substantially uniform higher rate than the spurious noise component A, and the spurious noise component D is suppressed at a far higher rate than the spurious noise components B, A. The elastic surface wave apparatus of this invention suppresses the spurious noise components B, D to substantially the same extent as the prior art apparatus when the above-mentioned inclination angle stands at zero. Where, however, said inclination ranges between 0.5° and 7°, the apparatus of this invention suppresses the spurious noise component A more prominently than the prior art apparatus which can only suppress said spurious noise component A by 7.4 (dB).

FIG. 6 is a curve diagram showing the relationship between the frequency of an input signal and a relative output (dB) when the angle of inclination defined by the main propagation axis T of an elastic wave with the Z axis indicates 0°, 2° and 4° in the elastic surface apparatus of this invention constructed as illustrated in FIG. 2. Where comparison is made between inclination angles $\theta$ of 0°, 2° and 4° with respect to ripple components contained in relative outputs (dB) corresponding to a frequency band extending equally 3 MHz ahead of and behind the central frequency of 30 MHz of an input signal, namely, a frequency band totaling 6 MHz, then it is seen from FIG. 6 that an inclination angle $\theta$ of 2° gives rise to the least ripple component, that is, only produces a ripple component of 1 (dB) at most and an inclination angle $\theta$ of 4° more decreases a ripple component than that of 0°, providing a smoother curve. The experimental results shown in FIG. 6 prove the elastic surface apparatus of FIG. 2 to be adapted for use as filter.

FIG. 7 presents the relationship between the angle of inclination defined by the main propagation axis T of an elastic surface wave with the Z axis and the extent to which spurious noise components are suppressed, where a distance L between the transmission and reception electrode pairs 2, 3 was varied. The curve 51 represents the case where the distance L was set at 1 mm, and the curve 52 denotes the case where the distance L was changed to 4.5 mm. As apparent from FIG. 7, the elastic surface wave apparatus of this invention can effectively suppress spurious noise components independently of the above-mentioned distance L, provided the angle of inclination defined by the main propagation axis T of an elastic surface wave with the Z axis falls within the range of 0.5° to 7°.

FIGS. 8 and 9 jointly represent an elastic surface wave apparatus according to another embodiment of this invention, wherein a substrate over which an elastic surface wave is propagated is formed of a glass plate 61. Two Y-cut piezoelectric substrates 62, 63 of lithium niobate ($LiNbO_3$) are mounted on both end portions of said glass plate 61. The piezoelectric substrates 62, 63 have a surface defined by the X and Z axes, with the Z axis set parallel with the lengthwise direction of the glass plate 61. The main propagation axis T of an elastic surface wave generated by the transmission and reception electrode pairs 2, 3 is inclined relative to the Z axis within the range of 0.5° to 7°, for example, 2°.

The electrode pairs 2, 3 consist of interdigitated units as in the embodiment of FIG. 2. The arrangement of FIGS. 8 and 9 can suppress spurious noise components as effectively as the embodiment of FIG. 2.

According to the embodiment of FIG. 2, the piezoelectric substrate 1 had a rectangular form, the lengthwise side of which was made parallel with the Z axis and the crosswise side of which was made parallel with the X axis. As shown in FIG. 10, however, the piezoelectric substrate 80 may have a rhomboidal parallelogram, the lengthwise side 81 of which is made parallel with the Z axis and the crosswise sides 84, 85 of which are made parallel with the corresponding sides of the transmission and reception electrode pairs 2, 3 respectively.

FIG. 11 is a curve diagram showing the ripple characteristic of an elastic surface wave apparatus using a piezoelectric substrate 80 of rhomboidal parallelogram shown in FIG. 10, wherein the main propagation axis T of an elastic surface wave defines inclination angles $\theta$ of 0°, 2°, 3° and 4° with the Z axis. FIG. 11 shows that where an input signal had a frequency band width of 6 MHz (with the central frequency taken to be 30 MHz), an elastic surface wave apparatus according to the embodiment of FIG. 10 more decreased a ripple component when the inclination angles $\theta$ stood at 2°, 3° and 4° than the prior art apparatus wherein the inclination angle $\theta$ was set at 0°, thus presenting smoother curves. Further, this invention obviously decreased the height of a ripple to 2 (dB) at maximum, though the prior art reduced said ripple height to 2.5 (dB) at most.

A modification of the subject elastic surface wave apparatus shown in FIG. 12 comprises a rectangular piezoelectric substrate 90, the lengthwise side 91 of which is made parallel with the main propagation axis T of an elastic surface wave, and transmission and reception electrode pairs 92, 93 formed of interdigitated units which are disposed parallel with the crosswise sides 94, 95 of the rectangular piezoelectric substrate 90 respectively. In this case, the crystalline axis Z is inclined at an angle $\theta$ relative to the main propagation axis T of an elastic surface wave, namely, the lengthwise side 91 of the rectangular piezoelectric substrate 90. This arrangement can obviously suppress spurious noise components as effectively as any of the preceding embodiments.

What we claim is:
1. An elastic surface wave apparatus which comprises a Y-cut piezoelectric substrate of lithium niobate ($LiNbO_3$) and provided with a surface defined by the X and Z axes and at least one electrode pair for converting an electric signal into an elastic surface wave which is disposed on said surface at an angle of inclination ranging betwween 0.5° and 7° relative to the Z axis so as to cause an elastic surface wave to be propagated in a direction inclined at an angle ranging from 0.5° to 7° relative to the Z axis.

2. The elastic surface wave apparatus according to claim 1, wherein the transmission and reception electrode pairs are disposed on the surface of the piezoelectric substrate at a prescribed distance.

3. The elastic surface wave apparatus according to claim 1, which comprises an insulation substrate over the surface of which an elastic surface wave can be propagated; first and second Y-cut piezoelectric substrates of lithium niobate ($LiNbO_3$) spatially arranged on the surface of said insulation substrate, and provided with a surface defined by the X and Z axes; and one electrode pair for converting on electric signal into an elastic surface wave which is mounted on each of said first and second piezoelectric substrates at an angle of inclination ranging between 0.5° to 7° relative to the Z axis.

4. The elastic surface wave apparatus according to claim 1, wherein the piezoelectric substrate has a rectangular form, the lengthwise side of which is made parallel with the Z axis and the crosswise side of which is made parallel with the X axis.

5. The elastic surface wave apparatus according to claim 1, wherein the piezoelectric substrate has a rhomboidal parallelogram, the lengthwise side of which is made parallel with the Z axis, and the crosswise side of which is disposed at right angles to the main propagation axis of an elastic surface wave.

6. The elastic surface wave apparatus according to claim 1, wherein the piezoelectric substrate has a rectangular form, the lengthwise side of which is made parallel with the main propagation axis of an elastic surface wave, and the crosswise side of which is disposed at right angles to the main propagation axis of an elastic surface wave.

* * * * *